(12) United States Patent
Brandenburg et al.

(10) Patent No.: US 10,849,217 B2
(45) Date of Patent: Nov. 24, 2020

(54) ELECTRICAL-CIRCUIT ASSEMBLY WITH HEAT-SINK

(71) Applicant: Aptiv Technologies Limited, St. Michael (BB)

(72) Inventors: Scott D. Brandenburg, Kokomo, IN (US); Manuel R. Fairchild, Kokomo, IN (US); Paul R. Martindale, Carmel, IN (US)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 16/026,261

(22) Filed: Jul. 3, 2018

(65) Prior Publication Data
US 2020/0008291 A1 Jan. 2, 2020

Related U.S. Application Data

(60) Provisional application No. 62/692,979, filed on Jul. 2, 2018.

(51) Int. Cl.
*H05K 1/02* (2006.01)
*H05K 7/20* (2006.01)

(52) U.S. Cl.
CPC .......... *H05K 1/021* (2013.01); *H05K 7/2029* (2013.01); *H05K 7/20163* (2013.01)

(58) Field of Classification Search
CPC .. H05K 1/021; H05K 7/20163; H05K 7/2029; H05K 7/20336; H05K 7/20318;
(Continued)

(56) References Cited

U.S. PATENT DOCUMENTS 5,608,610 A * 3/1997 Brzezinski .......... H01L 23/3675
257/713
6,082,443 A 7/2000 Yamamoto et al.
(Continued)

FOREIGN PATENT DOCUMENTS

CN 1864895 11/2006
CN 1877241 12/2006
(Continued)

OTHER PUBLICATIONS

"European Search Report", EP Application No. 19180619.9, dated Nov. 19, 2019, 2 pages.
(Continued)

*Primary Examiner* — Binh B Tran
*Assistant Examiner* — Michael A Matey
(74) *Attorney, Agent, or Firm* — Colby Nipper PLLC

(57) ABSTRACT

An electrical-circuit assembly includes an electrical-device and a heat-sink. The heat-sink has a base having a first-surface and a second-surface. The first-surface is in thermal communication with the electrical-device. The heat sink also has a lid having a third-surface and a fourth-surface. The third-surface faces toward the second-surface. The heat sink also has side-walls disposed between the base and the lid extending from the second-surface to the third-surface. The base, the lid, and the side-walls define a cavity. The heat sink also has a porous-structure extending from the second-surface toward the third-surface terminating a portion of the distance between the second-surface and the third-surface thereby defining a void between the porous-structure and the third-surface. The base, the side-walls, and the porous-structure are integrally formed of a common material. The porous-structure is characterized as having a contiguous-porosity network. The heat sink also has a heat-transfer-fluid disposed within the cavity.

17 Claims, 3 Drawing Sheets

(58) Field of Classification Search
CPC ............... H05K 7/2039; H05K 1/0203; H05K 7/20309; H05K 7/20409; H05K 1/0272; H05K 1/181; H05K 2201/064; H05K 2201/066; H05K 7/20; H05K 7/205; H05K 7/20881; H05K 7/209; H05K 7/20927; H01L 23/427; H01L 21/4871; F28D 15/0233; F28D 15/046; F28D 15/04; F28D 15/02; F28D 2021/0029; F28F 21/081; F28F 2260/02; F28F 21/08; G06F 2200/201

See application file for complete search history.

(56) References Cited

U.S. PATENT DOCUMENTS

| | | | | |
|---|---|---|---|---|
| 6,901,994 | B1* | 6/2005 | Jin-Cherng | F28D 15/046 165/104.26 |
| 6,945,317 | B2* | 9/2005 | Garner | F28D 15/0233 165/104.26 |
| 8,074,706 | B2* | 12/2011 | Su | F28D 15/046 165/104.26 |
| 8,102,670 | B2* | 1/2012 | Sakamoto | H05K 1/144 361/792 |
| 8,462,508 | B2* | 6/2013 | Lankston, II | F28D 15/0233 361/700 |
| 8,659,892 | B2* | 2/2014 | Yan | H01L 23/427 361/679.52 |
| 8,813,834 | B2* | 8/2014 | Chin | H01L 23/427 165/104.26 |
| 8,857,502 | B2* | 10/2014 | Huang | F28D 15/0233 165/104.26 |
| 2003/0173059 | A1* | 9/2003 | Edelmann | H05K 7/20454 165/80.2 |
| 2004/0130022 | A1* | 7/2004 | Shizuno | H01L 23/3114 257/735 |
| 2005/0022975 | A1* | 2/2005 | Rosenfeld | B22F 3/1103 165/104.11 |
| 2005/0098300 | A1* | 5/2005 | Kawabata | F28F 3/02 165/80.3 |
| 2005/0230085 | A1* | 10/2005 | Valenzuela | F28D 15/0233 165/104.26 |
| 2006/0124281 | A1* | 6/2006 | Rosenfeld | F28D 15/046 165/104.26 |
| 2007/0025085 | A1 | 2/2007 | Chang | |
| 2007/0090737 | A1* | 4/2007 | Hu | F21K 9/00 313/11 |
| 2007/0127217 | A1* | 6/2007 | Schwarz | H05K 7/20454 361/720 |
| 2009/0151905 | A1* | 6/2009 | Lai | H01L 23/427 165/104.26 |
| 2010/0071879 | A1* | 3/2010 | Hou | F28D 15/046 165/104.26 |
| 2010/0265709 | A1* | 10/2010 | Liu | F21K 9/00 362/249.02 |
| 2010/0309940 | A1* | 12/2010 | Lee | F28D 15/0233 372/34 |
| 2011/0108142 | A1* | 5/2011 | Liu | H01L 23/427 137/561 R |
| 2014/0083653 | A1* | 3/2014 | Kempers | F28D 15/046 165/104.26 |
| 2014/0268548 | A1* | 9/2014 | Rice | F25B 21/02 361/679.47 |
| 2014/0345843 | A1* | 11/2014 | Kirkor | F28F 23/00 165/185 |
| 2015/0198375 | A1* | 7/2015 | Saito | F28D 15/02 165/104.21 |
| 2016/0064355 | A1* | 3/2016 | Pan | H01L 25/0657 257/704 |
| 2016/0343639 | A1 | 11/2016 | Groothuis et al. | |
| 2017/0318702 | A1* | 11/2017 | Basu | F28D 15/0233 |
| 2017/0338167 | A1* | 11/2017 | Bozorgi | F28F 21/086 |
| 2019/0014688 | A1* | 1/2019 | Weibel | B23P 15/26 |
| 2019/0141855 | A1* | 5/2019 | Inagaki | H01L 23/427 |
| 2019/0357387 | A1* | 11/2019 | Peterson | H05K 7/20327 |

FOREIGN PATENT DOCUMENTS

| | | |
|---|---|---|
| CN | 202485508 | 10/2012 |
| CN | 203807965 | 9/2014 |
| CN | 205546384 | 8/2016 |
| CN | 106793685 | 5/2017 |
| CN | 107695318 | 2/2018 |
| WO | 2017100568 | 6/2017 |
| WO | 2018003957 | 4/2019 |

OTHER PUBLICATIONS

"Foreign Office Action", CN Application No. 201910547500.X, dated Apr. 1, 2020, 19 pages.

* cited by examiner

| PORE DIAMETER (mm) | 0.0 - 0.2 | 0.21 - 0.40 | 0.41 - 0.60 | 0.61 - 0.80 | 0.81 - 1.0 | 1.0 - 1.2 | > 1.21 |
|---|---|---|---|---|---|---|---|
| NUMBER OF PORES | 600 | 225 | 65 | 32 | 12 | 8 | 10 |

ELECTRICAL-CIRCUIT ASSEMBLY WITH HEAT-SINK

TECHNICAL FIELD OF INVENTION

This disclosure generally relates to an electrical-circuit assembly, and more particularly relates to an electrical-circuit assembly with a heat-sink.

BRIEF DESCRIPTION OF DRAWINGS

The present invention will now be described, by way of example with reference to the accompanying drawings, in which:

FIG. 3 is a table illustrating a pore size distribution of a porous-structure of the electrical-circuit assembly of FIG. 1 in accordance with one embodiment.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
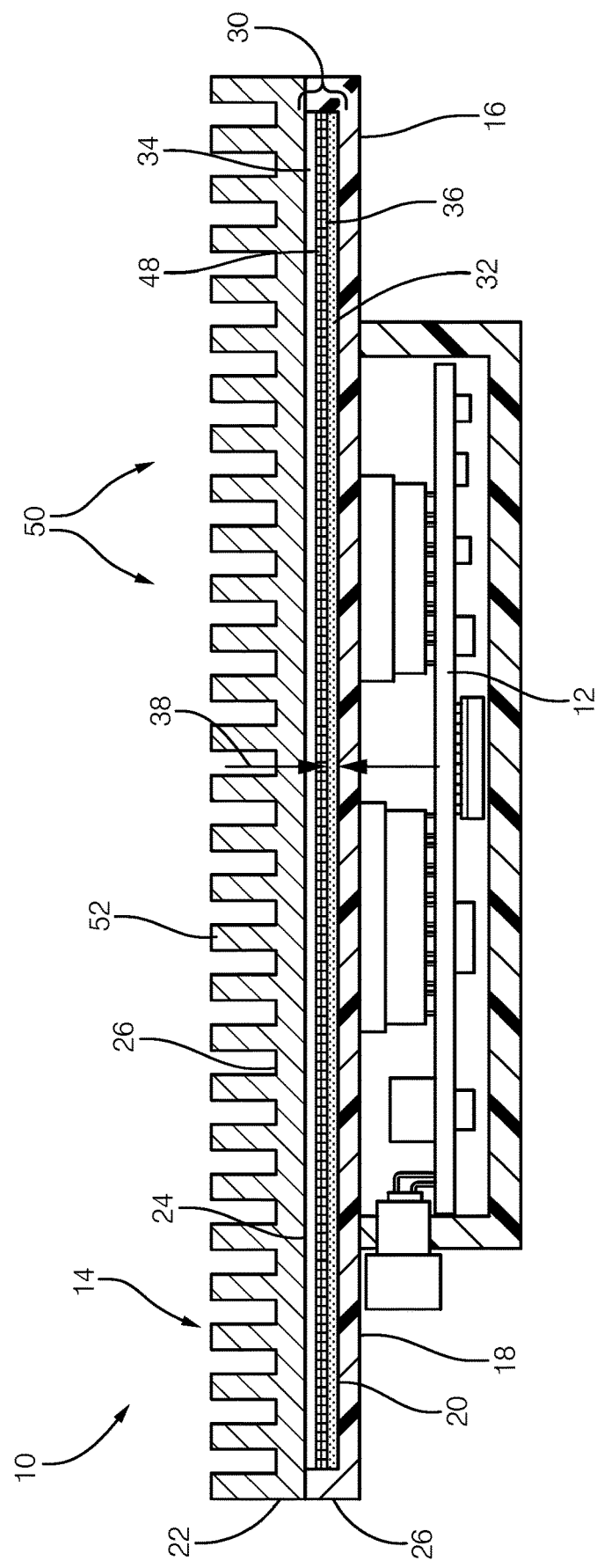
FIG. 1 is a section view of an illustration of an electrical-circuit assembly in accordance with one embodiment.

FIG. 1 illustrates is a section view of an electrical-circuit assembly 10, hereafter referred to as the assembly 10. As will be described in more detail below, the assembly 10 is an improvement on previous electrical-circuit-assemblies because the assembly 10 passively cools an electrical-device 12. As used herein, the term "passively" means that no mechanical pump or fan mechanism is used to cool the assembly, that would typically require an external power source, add cost, and increase a package-size.

The assembly 10 includes the electrical-device 12. The electrical-device 12 may be any electrical-device 12 that may benefit from cooling (i.e. heat removal) during operation, including, but not limited to, capacitors, resistors, inductors, amplifiers, micro-processors, etc., or any combination thereof, as will be recognized by one skilled in the art. The electrical-device 12 may include printed-circuit-boards formed of epoxy-resins, polyimide-resins, and/or ceramics. The electrical-device 12 may be a vehicle-controller, such as that used for controlling an autonomous-vehicle, which typically generates more heat than a typical vehicle-controller, due to the increased microprocessor demands required for autonomous driving.

The assembly 10 also includes a heat-sink 14 operable to remove heat from the electrical-device 12. The heat-sink 14 includes a base 16 having a first-surface 18 and a second-surface 20 opposite the first-surface 18. The base 16 may be formed of any material that is heat-conducting. In the example illustrated in FIG. 1, the base 16 is formed of an aluminum-alloy that is die-cast. The first-surface 18 of the base 16 is in thermal communication with the electrical-device 12. That is, the first-surface 18 provides a path for heat to be conducted away from the electrical-device 12.

The heat-sink 14 also includes a lid 22 having a third-surface 24 and a fourth-surface 26 opposite the third-surface 24. In the example illustrated in FIG. 1 the lid 22 is formed of an aluminum-alloy that is die-cast. The lid 22 is arranged so the third-surface 24 faces toward the second-surface 20. The lid 22 may be attached to the base 16 by any method to preferably form a hermetic-seal, including welding, soldering, adhesives, etc., and in the example illustrated in FIG. 1, the lid 22 is friction stir welded to the base 16 forming a metallurgical bond.

The heat-sink 14 also includes side-walls 28 disposed between the base 16 and the lid 22 extending from the second-surface 20 to the third-surface 24 and define a perimeter of the heat-sink 14. The base 16, the lid 22, and the side-walls 28 cooperate to define a cavity 30.

The heat-sink 14 also includes a porous-structure 32 extending from the second-surface 20 toward the third-surface 24. The porous-structure 32 terminates (i.e. ends, stops, etc.) a portion of a distance between the second-surface 20 and the third-surface 24 thereby defining a void 34 between the porous-structure 32 and the third-surface 24. That is, the porous-structure 32 does not completely fill the cavity 30 and leaves the void 34 between the porous-structure 32 and the third-surface 24. The base 16, the side-walls 28, and the porous-structure 32 are integrally formed of a common material (e.g. die-cast aluminum-alloy). That is, the base 16, the side-walls 28, and the porous-structure 32 are formed as one unit during the die-casting process and are not formed as a result of welding separate die-case components together, or sintering powdered metals to create the porous-structure 32. The porous-structure 32 is characterized as having a contiguous-porosity network. That is, fluidic communication exists throughout the entire porous-structure 32 enabling a flow of fluids through the porous-structure 32. In contrast, the second-surface 20, the side-walls 28, and the third-surface 24 inhibit the flow of fluid through their respective sections. The porous-structure 32 is formed by controlling porosity in the base 16 during the die-casting process, as will be appreciated by those skilled in the art of die-casting. The porous-structure 32 defines an exposed-surface 36 that faces the third-surface 24. The exposed-surface 36 is created by removing a portion of a surface-skin, formed during die-casting, from the base 16 by mechanical and/or chemical processing. A depth 38 of the porous-structure 32 is in a range from about 1.0 millimeters to about 4.0 millimeters. The porous-structure 32 is characterized by a percent-porosity 40 in a range from about 48-percent to about 74-percent.

Figure 2B:
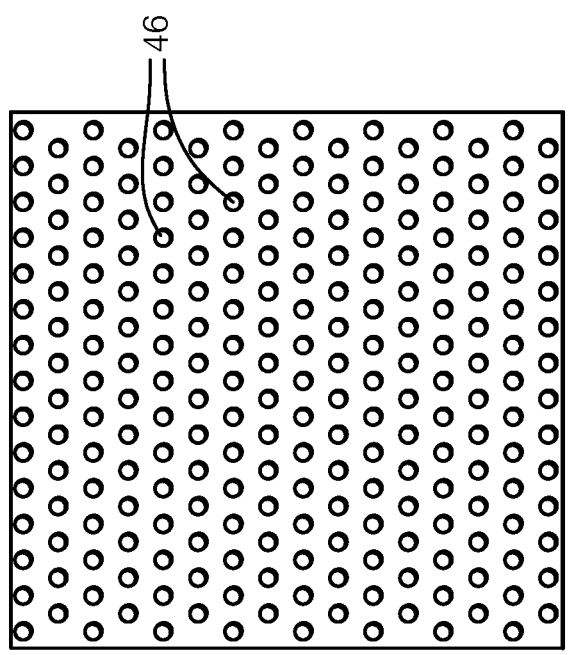
FIG. 2B is an illustration of dimples cast into the base of the electrical-circuit assembly of FIG. 1 in accordance with one embodiment.
Figure 2A:
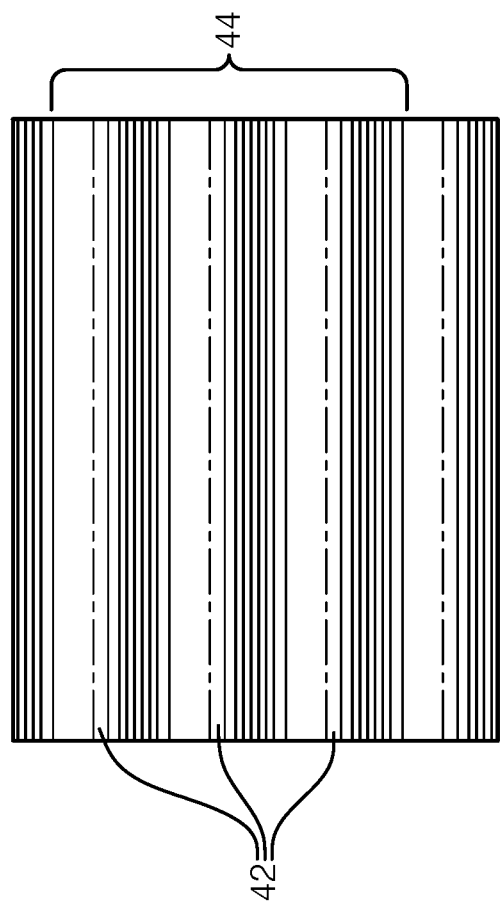
FIG. 2A is an illustration of ribs cast into a base of the electrical-circuit assembly of FIG. 1 in accordance with one embodiment.

FIGS. 2A-2B illustrate portions of the base 16 within the cavity 30 before the surface-skin is removed. In one embodiment, the portion of the base 16 within the cavity 30 is cast with a planar-surface (not shown). In another embodiment (see FIG. 2A), the portion of the base 16 within the cavity 30 is cast with ribs 42 forming an undulating-surface, wherein when the surface-skin is removed the exposed-surface 36 is characterized as having undulations 44. In yet another embodiment (see FIG. 2B), dimples 46 (i.e. depressions, embossments, etc.) are cast into the portion of the base 16 within the cavity 30 to create the undulating-surface and may increase the heat conduction in a direction normal to the second-surface 20. Other structures may be formed in the base 16 within the cavity 30 by bead-blasting or other means that also create undulations 44 in the exposed-surface 36.

FIG. 3 is a table that illustrates an example of a preferred pore-size-distribution that may be developed in the porous-structure 32 based on a rate-of-casting, entrained gas, and other casting parameters that will be appreciated by those in the art. A pore diameter range and the number of pores in the respective range are listed.

Referring back to FIG. 1, the assembly 10 also includes a heat-transfer-fluid 48 disposed within the cavity 30 and occupies a portion of the cavity 30 (i.e. the cavity 30 is not completely filled with the heat-transfer-fluid 48). The heat-transfer-fluid 48 may be any heat-transfer-fluid 48 with a boiling-point suited to the thermal environment of the application. In the example illustrated in FIG. 1, the heat-transfer-fluid 48 is acetone. In other applications a mixture of water and ethylene glycol may be used for the heat-transfer-fluid 48. The heat-transfer-fluid 48 is heated by the second-surface 20 from the heat conducted away from the electrical-device 12. The heat-transfer-fluid 48 evaporates, transports across the porous-structure 32 and across the void 34 in the cavity 30, and condenses on the third-surface 24 thereby distributing the heat over the third-surface 24. The condensed heat-transfer-fluid 48 returns to the porous-structure 32 that acts as a wicking-plane to direct the liquid heat-transfer-fluid 48 back to the desired heat producing location (e.g. the locations of greatest heat conduction from the electrical-device 12). This closed-system (i.e. sealed system) is beneficial because it does not require the heat-transfer-fluid 48 to be replenished, or transferred into and/or out of the cavity 30. Experimentation by the inventors indicates that the heat-transfer capability of the assembly 10 as describe above is in excess of 40,000 Watts/meter-Kelvin (40,000 W/mK), compared to only 140 W/mK for a typical solid aluminum-heat-sink.

Referring again to FIG. 1, the fourth-surface 26 is configured to dissipate the heat generated by the electrical-device 12 to a surrounding environment 50, and in one embodiment includes cooling-fins 52 extending beyond the fourth-surface 26.

Accordingly, an electrical-circuit-assembly 10 (the assembly 10 is provided. The assembly 10 is an improvement over other electrical-circuit-assemblies because the assembly 10 passively transfers heat away from the electrical-device 12 at a greater rate than the typical solid aluminum-heat-sink.

While this invention has been described in terms of the preferred embodiments thereof, it is not intended to be so limited, but rather only to the extent set forth in the claims that follow. "One or more" includes a function being performed by one element, a function being performed by more than one element, e.g., in a distributed fashion, several functions being performed by one element, several functions being performed by several elements, or any combination of the above. It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact. The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

We claim:

1. An electrical-circuit assembly, the assembly comprising:
   a heat-sink having:
   a base formed of a die cast aluminum alloy, the base having a first-surface and a second-surface opposite the first-surface, the first-surface in thermal communication with an electrical-device;
   a lid having a third-surface and a fourth-surface opposite the third-surface, the lid arranged so the third-surface faces toward the second-surface;
   side-walls formed of the die cast aluminum alloy integral to the base and disposed between the base and the lid extending from the second-surface to the third-surface, wherein the base, the lid, and the side-walls cooperate to define a cavity;
   a porous-structure formed of the die cast aluminum alloy integral to the base and the side-walls, and extending from the second-surface toward the third-surface, the east porous-structure terminating a portion of a distance between the second-surface and the third-surface thereby defining a void between the east porous-structure and the third-surface;
   the void extending along the entire east porous-structure and terminating on the side-walls;
   the porous-structure having a contiguous-porosity network; and
   a heat-transfer-fluid disposed within the cavity and the contiguous-porosity network of the porous-structure.

2. The assembly in accordance with claim 1, wherein the heat-transfer-fluid occupies a portion of the cavity and a portion of the porous-structure.

3. The assembly in accordance with claim 1, wherein a depth of the porous-structure is in a range from about 1.0 millimeters to about 4.0 millimeters.

4. The assembly in accordance with claim 1, wherein the fourth-surface is configured to dissipate heat generated by the electrical-device to a surrounding environment.

5. The assembly in accordance with claim 1, wherein the fourth-surface includes cooling-fins extending beyond the fourth-surface.

6. The assembly in accordance with claim 1, wherein the contiguous-porosity network is characterized by a percent-porosity in a range from about 48 percent to about 74 percent.

7. The assembly in accordance with claim 1, wherein the porous-structure defines an exposed-surface that is adjacent to the void.

8. The assembly in accordance with claim 7, wherein the exposed-surface is a planar-surface.

9. The assembly in accordance with claim 7, wherein the exposed-surface has undulations.

10. The assembly in accordance with claim 9, wherein the undulations include at least one of ribs or dimples.

11. A heat-sink comprising:
   a base formed of a die cast aluminum alloy, the base having a first-surface and a second-surface opposite the first-surface, the first-surface configured for thermal communication with an electrical-device;
   a lid having a third-surface and a fourth-surface opposite the third-surface, the lid arranged so the third-surface faces toward the second-surface;
   side-walls formed of the die cast aluminum alloy integral to the base and disposed between the base and the lid extending from the second-surface to the third-surface, wherein the base, the lid, and the side-walls cooperate to define a cavity;
   a single porous-structure formed of the die cast aluminum alloy integral to the base and the side-walls, and extending from the second-surface toward the third-surface, the single porous-structure terminating a portion of a distance between the second-surface and the third-surface thereby defining a void between the single east porous-structure and the third-surface;
      the void extending along the entire porous-structure and terminating on the side-walls;
      the single porous-structure having a contiguous-porosity network; and
   a heat-transfer-fluid disposed within the cavity and the contiguous-porosity network of the porous-structure.

12. The heat-sink in accordance with claim 11, wherein the single porous-structure defines an exposed-surface adjacent to the void.

13. The heat-sink in accordance with claim 12, wherein the exposed-surface is a planar-surface.

14. The heat-sink in accordance with claim 12, wherein and the exposed-surface has undulations.

15. The heat-sink in accordance with claim 14, wherein the undulations include at least one of ribs or dimples.

16. A method of making a heat-sink, comprising:
   die-casting, from an aluminum alloy, a base;
      the base having a first-surface and a second-surface opposite the first-surface, a single porous-structure, and side-walls;
      the first-surface, second-surface, single porous-structure, and side-walls formed integral to the base and defining a cavity;
      the first-surface configured for thermal communication with an electrical-device;
      the single porous-structure having a contiguous-porosity network;
   die-casting a lid;
      the lid having a third-surface and a fourth-surface opposite the third-surface;
   exposing a surface of the porous-structure;
   dispensing a heat-transfer-fluid within the cavity and the contiguous-porosity network of the porous-structure; and
   joining the lid to the side-walls;
      the lid arranged such that the third-surface faces toward the second-surface of the base;
      the single east porous-structure extending from the second-surface of the base toward the third-surface of the lid;
      the single porous-structure terminating a portion of a distance between the second-surface and the third-surface thereby defining a void between the single porous-structure and the third-surface;
      the void extending along the entire porous-structure and terminating on the side-walls.

17. A method of cooling an electrical-circuit assembly, comprising:
   providing a heat-sink having:
      a base formed of a die cast aluminum alloy, the base having a first-surface and a second-surface opposite the first-surface, the first-surface in thermal communication with an electrical-device;
      a lid having a third-surface and a fourth-surface opposite the third-surface, the lid arranged so the third-surface faces toward the second-surface;
      side-walls formed of the die cast aluminum alloy integral to the base and disposed between the base and the lid extending from the second-surface to the third-surface, wherein the base, the lid, and the side-walls cooperate to define a cavity;
      a porous-structure formed of the die cast aluminum alloy integral to the base and the side-walls, and extending from the second-surface toward the third-surface, the porous-structure terminating a portion of a distance between the second-surface and the third-surface thereby defining a void between the porous-structure and the third-surface;
      the void extending along the entire porous-structure and terminating on the side-walls;
      the porous-structure having a contiguous-porosity network; and
   disposing a heat-transfer-fluid within the cavity and the contiguous-porosity network of the porous-structure.

* * * * *